United States Patent
Lee et al.

(10) Patent No.: US 11,545,382 B2
(45) Date of Patent: *Jan. 3, 2023

(54) INTEGRATED CHIP DIE CARRIER EXCHANGER

(71) Applicant: Taiwan Semiconductor Manufacturing Co., Ltd., Hsin-Chu (TW)

(72) Inventors: Chien-Fa Lee, Hsinchu (TW); Hsu-Shui Liu, Pingjhen (TW); Jiun-Rong Pai, Jhubei (TW); Pin-Yi Hsin, Jhubei (TW); Shou-Wen Kuo, Hsinchu (TW); Patrick Lin, Zhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/853,846

(22) Filed: Apr. 21, 2020

(65) Prior Publication Data

US 2020/0251367 A1 Aug. 6, 2020

Related U.S. Application Data

(63) Continuation of application No. 15/249,801, filed on Aug. 29, 2016, now Pat. No. 10,665,489.

(Continued)

(51) Int. Cl.
*B08B 3/04* (2006.01)
*H01L 21/677* (2006.01)
*B08B 3/08* (2006.01)

(52) U.S. Cl.
CPC ........ *H01L 21/67781* (2013.01); *B08B 3/041* (2013.01); *B08B 3/08* (2013.01); *H01L 21/67724* (2013.01)

(58) Field of Classification Search
USPC ........................................ 414/405
See application file for complete search history.

(56) References Cited

U.S. PATENT DOCUMENTS 3,516,227 A * 6/1970 Peppler ................. B65B 7/2807
53/306
5,507,085 A 4/1996 Easton et al.
(Continued)

OTHER PUBLICATIONS

Yannou, et al. "SET Technical Bulletin: Die Bonding Applications." Smart Equipment Technology. Apr. 5, 2010.
(Continued)

*Primary Examiner* — Ronald P Jarrett
(74) *Attorney, Agent, or Firm* — Eschweiler & Potashnik, LLC

(57) ABSTRACT

The present disclosure, in some embodiments, relates to an integrated chip processing tool. The integrated chip processing tool includes a first transfer module and a second transfer module. The first transfer module has a first robotic arm disposed within a housing. The first transfer module is configured to receive a single and unitary first die tray configured to hold a plurality of integrated chip (IC) die and to concurrently transfer all of the plurality of IC die held by the single and unitary first die tray to a single and unitary die boat. The second transfer module has an additional robotic arm disposed within the housing and configured to concurrently transfer all of the plurality of IC die from the single and unitary die boat to a single and unitary second die tray.

20 Claims, 4 Drawing Sheets

Related U.S. Application Data

(60) Provisional application No. 62/354,370, filed on Jun. 24, 2016.

(56) References Cited

U.S. PATENT DOCUMENTS

| | | | |
|---|---|---|---|
| 6,612,797 B1 * | 9/2003 | Bonora | H01L 21/67775 414/217 |
| 2003/0102016 A1 | 6/2003 | Bouchard | |
| 2003/0177633 A1 | 9/2003 | Haji et al. | |
| 2004/0191948 A1 | 9/2004 | Ertel et al. | |
| 2005/0072972 A1 | 4/2005 | Tashiro et al. | |
| 2007/0131881 A1 | 6/2007 | Kim et al. | |
| 2007/0172234 A1 * | 7/2007 | Shigemori | H01L 21/67225 396/611 |
| 2008/0040917 A1 | 2/2008 | Narita et al. | |
| 2010/0230885 A1 | 9/2010 | Di Stefano | |
| 2012/0112777 A1 * | 5/2012 | Aizawa | G01R 31/2867 324/750.08 |
| 2014/0306124 A1 | 10/2014 | Hara | |
| 2015/0279713 A1 | 10/2015 | Kokabu et al. | |
| 2015/0292154 A1 | 10/2015 | Zheng et al. | |

OTHER PUBLICATIONS

Anysillicon.com. "Packaging and Delivery Methodology for: Wafer, Die, and ICs." Jan. 15, 2013.
Non-Final Office Action dated Jan. 23, 2018 for U.S. Appl. No. 15/249,891.
Non-Final Office Action dated Aug. 3, 2018 for U.S. Appl. No. 15/249,891.
Final Office Action dated May 1, 2019 for U.S. Appl. No. 15/249,891.
Non-Final Office Action dated Sep. 5, 2019 for U.S. Appl. No. 15/249,891.
Notice of Allowance dated Jan. 15, 2020 for U.S. Appl. No. 15/249,891.

* cited by examiner

INTEGRATED CHIP DIE CARRIER EXCHANGER

REFERENCE TO RELATED APPLICATIONS

This application is a Continuation of U.S. application Ser. No. 15/249,801, filed on Aug. 29, 2016, which claims the benefit of U.S. Provisional Application No. 62/354,370, filed on Jun. 24, 2016. The contents of the above-referenced patent applications are hereby incorporated by reference in its entirety.

BACKGROUND

Integrated chips are fabricated by operating upon a semiconductor wafer (e.g., a silicon wafer) using a plurality of processing steps (e.g., etching steps, lithography steps, deposition steps, etc.). The processing steps form a plurality of stacked layers within and on the semiconductor wafer. The layers respectively comprise thousands of integrated chip components, such as transistor devices within the semiconductor wafer and interconnect layers overlying the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
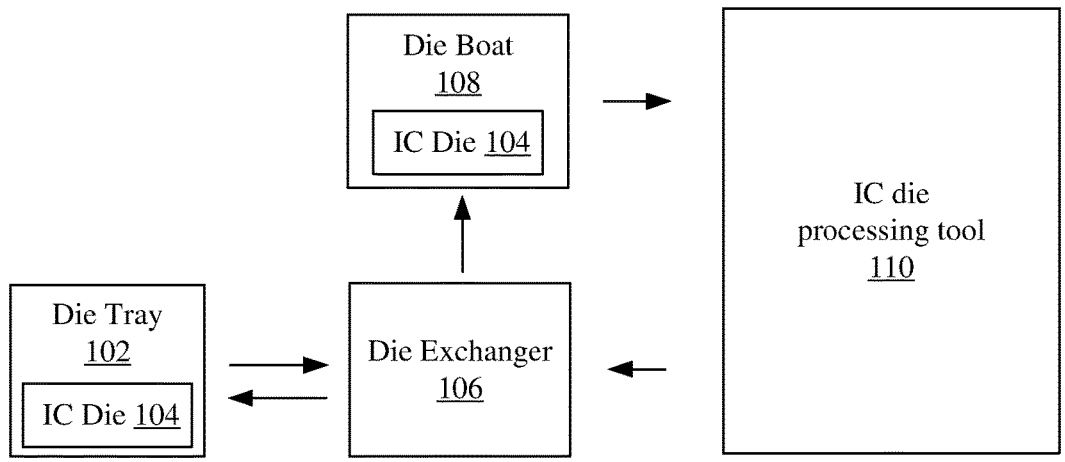
FIG. 1 illustrates some embodiments of a block diagram of an integrated chip processing tool comprising a die exchanger configured to automatically transfer a plurality of integrated chip (IC) die between a die tray and a die boat.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When the fabrication processes used to form integrated chips on a semiconductor wafer have been completed, the semiconductor wafer is diced to separate the semiconductor wafer into a plurality of separate integrated chip (IC) die. For example, a single semiconductor wafer may be diced into thousands of separate IC die. After dicing, the IC die are often transported to subsequent process tools using die trays. Die trays are plastic trays with a plurality of pockets or openings that are respectively configured to hold the separate IC die. The openings have a size corresponding to a size of the IC die and are separated by sidewalls that prevent the IC die from moving between adjacent openings.

After the dicing process, IC die are typically cleaned to remove residue of the dicing process from the IC die. To clean the IC die, the IC die are placed into a die boat that is provided to a die cleaning tool. The process of moving IC die between a die tray and the die boat is a manual process, which individually moves each IC die from the die tray to the die boat, and/or vice versa. This transfer process can be a time consuming process, which is costly to a high-volume fabrication facility. Moreover, manually moving the IC die between the die tray and the die boat introduces a risk of contamination and/or damage to the IC die.

The present disclosure relates to an integrated chip processing tool comprising a die exchanger configured to automatically transfer a plurality of integrated chip (IC) die between a die tray and a die boat, and an associated method. The integrated chip processing tool comprises a die exchanger configured to receive a die tray comprising a plurality of IC die. The die exchanger is configured to automatically transfer the plurality of IC die between the die tray and a die boat. An IC die processing tool is configured to receive the die boat from the die exchanger and to perform a processing step on the plurality of IC die within the die boat. By operating the die exchanger to automatically transfer the plurality of IC die between the die tray and the die boat, the transfer time can be reduced and damage and/or contamination risks related to a manual transfer of IC die can be mitigated.

FIG. 1 illustrates some embodiments of a block diagram of an integrated chip processing tool 100 comprising a die exchanger configured to automatically transfer a plurality of IC die between a die tray and a die boat.

The integrated chip processing tool 100 comprises a die exchanger 106 coupled to a IC die processing tool 110, which is configured to perform a processing step (e.g., a cleaning process) on a plurality of IC die 104. The die exchanger 106 is configured to automatically transfer the plurality of IC die 104 between a die tray 102 and a die boat 108. The die tray 102 is configured to hold the plurality of IC die 104 outside of the IC die processing tool 110, while the die boat 108 is configured to hold the plurality of IC die 104 within the IC die processing tool 110. The plurality of IC die 104 respectively comprise a portion of a semiconductor wafer that includes an integrated circuit. In some embodiments, the plurality of IC die 104 may have a square or rectangular shape.

In some embodiments, the die exchanger 106 is configured to receive the die tray 102 from an external source (e.g., a person), and to perform a first transfer operation that moves the plurality of IC die 104 from the die tray 102 to the die boat 108. After the first transfer operation is finished, the die exchanger 106 may input the die boat 108 into the IC die processing tool 110. The die exchanger 106 is further configured to receive the die boat 108 output from the IC die processing tool 110 (after the processing step is completed) and to perform a second transfer operation that moves the plurality of IC die 104 from the die boat 108 back to the die tray 102. After the second transfer operation is finished, the die exchanger 106 may output the die boat 108 to the external source. In some embodiments, the die exchanger 106 is configured to concurrently transfer the plurality of IC die 104 between the die tray 102 and the die boat 108, during the first and second transfer operations.

By operating the die exchanger 106 to automatically transfer the plurality of die between the die tray 102 and the die boat 108, the time used to transfer the plurality of IC die 104 between the die tray 102 and the die boat 108 can be reduced and errors related to a manual transfer of the plurality of IC die 104 can be mitigated.

Figure 2:
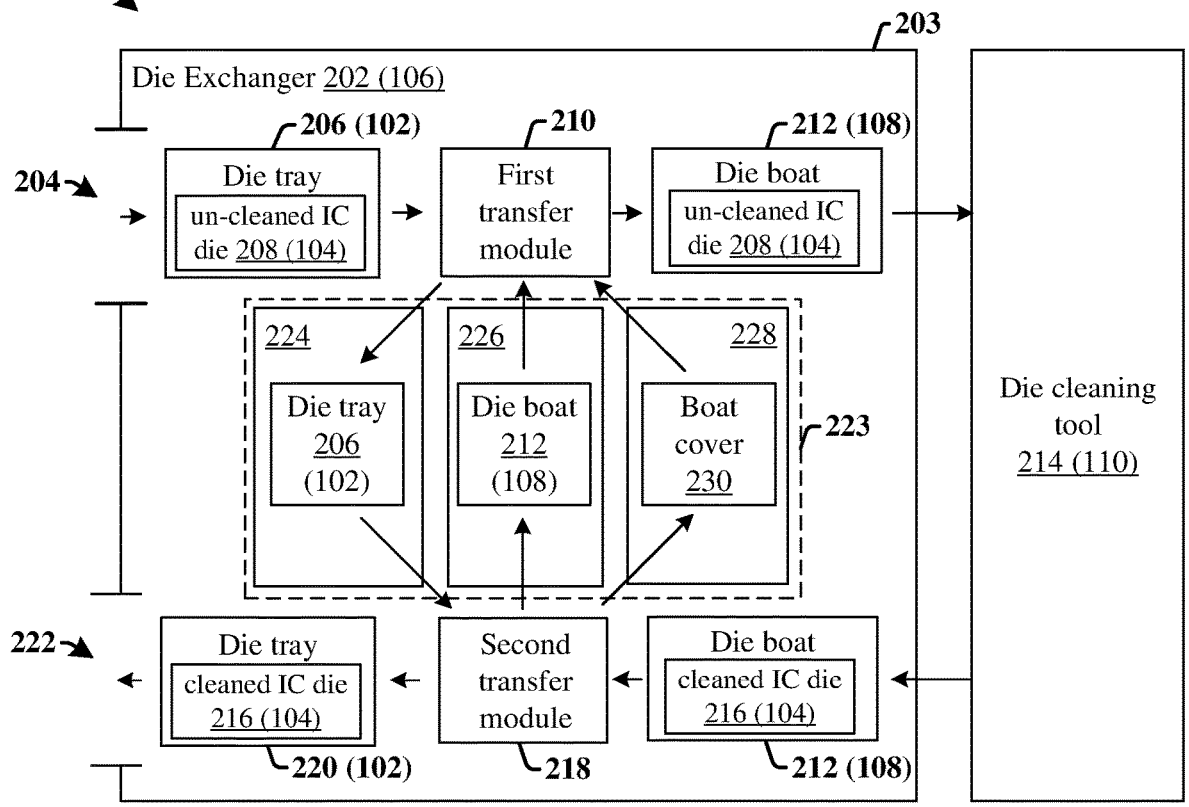
FIG. 2 illustrates some additional embodiments of an integrated chip processing tool comprising a die exchanger.

FIG. 2 illustrates some additional embodiments of an integrated chip processing tool 200 comprising a die exchanger.

The integrated chip processing tool 200 comprises a die exchanger 202 configured to automatically transfer a plurality of IC die, 208 and/or 216, between a die tray, 206 and/or 220, and a die boat 212. The die exchanger 202 comprises a housing 203 having an input port 204 and an output port 222. The input port 204 is configured to receive a die tray 206 comprising a plurality of un-cleaned IC die 208 from an external source. The output port 222 is configured to output a die tray 220 comprising a plurality of cleaned IC die 216 to the external source.

In some embodiments, the die tray 206 is provided from the input port 204 to a first transfer module 210. The first transfer module 210 is configured to automatically transfer the plurality of un-cleaned IC die 208 from the die tray 206 to the die boat 212. In some embodiments, the first transfer module 210 may also be configured to provide a boat cover 230 onto the die boat 212. The boat cover 230 covers the plurality of un-cleaned IC die 208 within the die boat 212, and thereby prevents the plurality of un-cleaned IC die 208 from falling out of the die boat 212 during subsequent processing steps.

The die boat 212 is provided from the first transfer module 210 to a die cleaning tool 214 configured to perform a cleaning process on the plurality of un-cleaned IC die 208 within the die boat 212. Once the die cleaning tool 214 has completed the cleaning process, the die cleaning tool 214 outputs the die boat 212 to a second transfer module 218. The die boat 212 output to the second transfer module 218 comprises the plurality of cleaned IC die 216. The second transfer module 218 is configured to transfer the plurality of cleaned IC die 216 from the die boat 212 to die tray 220, which is provided to the output port 222. In some embodiments, die tray 220 and die tray 206 may be a same die tray, while in other embodiments die tray 220 and die tray 206 may be different die trays.

In some embodiments, the die exchanger 202 may further comprise a buffer unit 223 configured to move the die tray 206, the die boat 212, and/or the boat cover 230 within the die exchanger 202 when they are not being used to carrying the plurality of IC die, 208 and/or 216. By moving the die tray 206, the die boat 212, and/or the boat cover 230 within the die exchanger 202, the die tray 206, the die boat 212, and/or the boat cover 230 can be used by both the first transfer module 210 and the second transfer module 218, thereby allowing for the die exchanger 202 to perform the transfer of IC die in a manner that is internally self-sufficient (i.e., in a manner that does not use die trays in additional to the die tray provided to the input port 204).

In some embodiments, the buffer unit 223 may comprise a tray buffer 224, a boat buffer 226, and a cover buffer 228. In such embodiments, after the first transfer module 210 has completed the transfer of the plurality of IC die 208 from the die tray 206 to the die boat 212, the first transfer module 210 is configured to provide the die tray 206 (which is empty) to the tray buffer 224. The tray buffer 224 is configured to move the die tray 206 to the second transfer module 218 (i.e., so that the die tray 206 that is provided to the die exchanger 202 is a same die tray 220 that is output from the die exchanger 202). After the second transfer module 218 has completed the transfer of the plurality of IC die 216 from the die boat 212 to the die tray 220, the second transfer module 218 is configured to provide the die boat 212 (which is empty) to the boat buffer 226 and the boat cover 230 to the cover buffer 228. The boat buffer 226 and the cover buffer 228 are configured to respectively transfer the die boat 212 and the boat cover 230 to the first transfer module 210, so that the die boat 212 and the boat cover 230 can be re-used during subsequent die transfer processes performed by the first transfer module 210.

Although the tray buffer 224, the boat buffer 226, and the cover buffer 228 are illustrated as transferring a single die tray, a single die boat, and a single boat cover, it will be appreciated that in some embodiments the tray buffer 224, the boat buffer 226, and the cover buffer 228 may concurrently transfer multiple die tray, die boats, and/or boat covers, thereby enabling the integrated chip processing tool 200 to process multiple die trays at a same time. Furthermore, in various embodiments, one or more of the tray buffer 224, a boat buffer 226, and a cover buffer 228 may be concurrently operated to concurrently transfer the die tray 206, the die boat 212, and/or the boat cover 230 between the first transfer module 210 and the second transfer module 218.

Figure 3A:
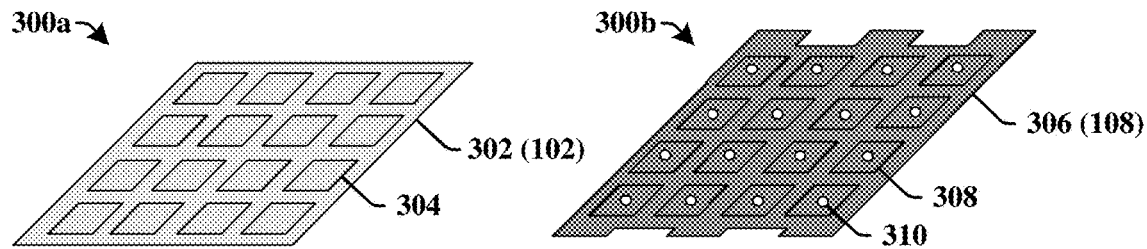
FIGS. 3A-3B illustrate three-dimensional (3D) views of some embodiments of an automated die transfer process performed by a disclosed transfer module.
Figure 3B:
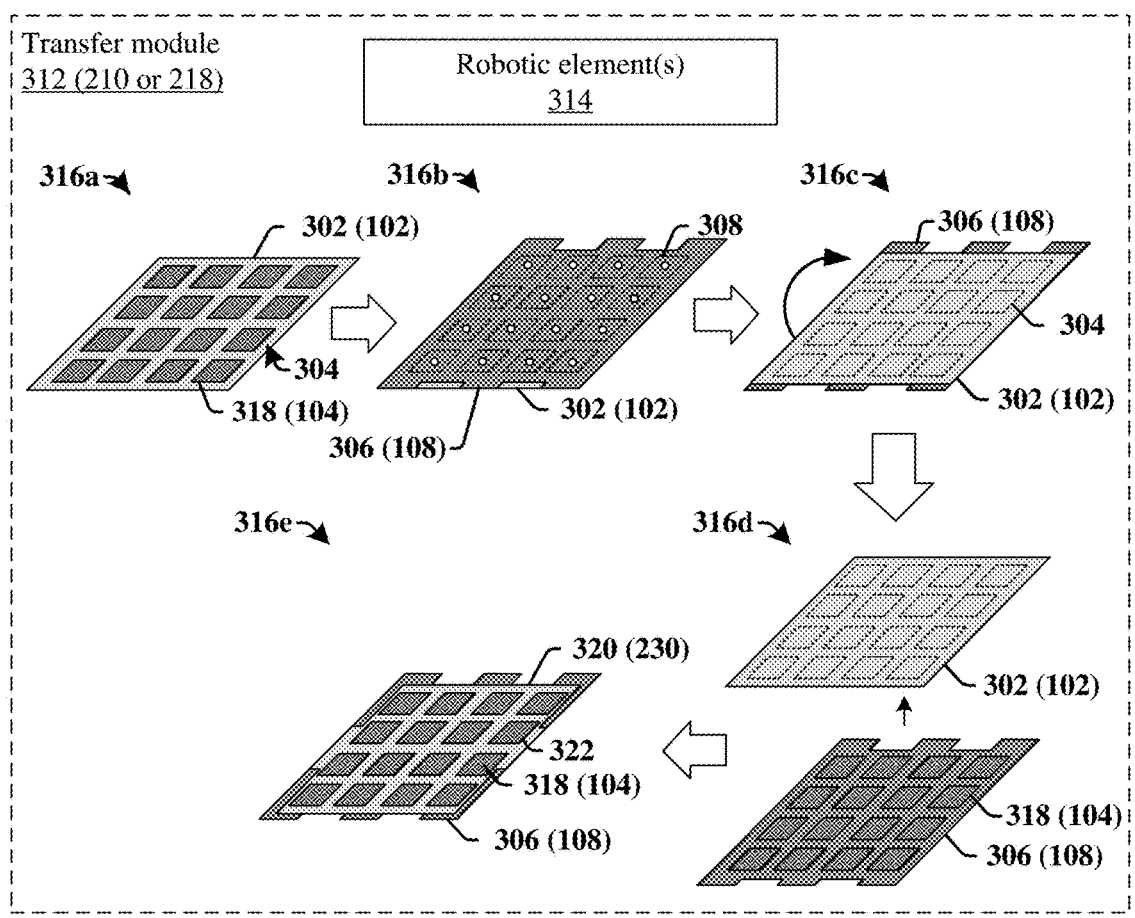

FIGS. 3A-3B illustrate three-dimensional (3D) views of some embodiments of an automated die transfer process performed by a disclosed transfer module.

FIG. 3A illustrates some embodiments of three-dimensional views, 300a and 300b, of a die tray 302 and a die boat 306, respectively. As shown in three-dimensional view 300a, the die tray 302 comprises a first plurality of openings 304 (i.e., depressions) within a front-side of the die tray 302. The first plurality of openings 304 are configured to hold a plurality of IC die. The first plurality of openings 304 are separated by sidewalls, which prevent the IC die from moving between adjacent ones of the first plurality of openings 304. In some embodiments, the die tray 302 may comprise a polymer or plastic material.

As shown in three-dimensional view 300b, the die boat 306 comprises a second plurality of openings 308 (i.e., depressions) within a front-side of the die boat 306, which are separated by sidewalls. The second plurality of openings 308 are configured to hold a plurality of IC die. In some embodiments, the second plurality of openings 308 within the die boat 306 may respectively have a hole 310 that extends through bottom surfaces of the second plurality of openings 308 to a back-side of the die boat 306. In some embodiments, the die boat 306 may comprise a metallic material (e.g., iron, nickel, etc.). In some embodiments, the die tray 302 may have a different footprint than the die boat 306.

In some embodiments, the first plurality of openings 304 within the die tray 302 and the second plurality of openings 308 within the die boat 306 may have a same number of openings and be located in a same layout. In other words, the first plurality of openings 304 within the die tray 302 may have a same size and be separated by a same spacing as the second plurality of openings 308 within the die boat 306. In some embodiments, the die tray 302 and the die boat 306 may have a number of openings that is greater than 50. For example, in some embodiments, the die tray 302 and the die boat 306 may each have 98 openings. In other embodiments, the die tray 302 and the die boat 306 may have a number of openings that is less than 50.

FIG. 3B illustrates some embodiments of a transfer module 312 having one or more robotic elements 314 configured to automatically transfer a plurality of IC die between a die tray 302 and a die boat 306.

As shown in three-dimensional view 316a, the transfer module 312 is configured to receive a die tray 302 comprising a plurality of IC die 318. The plurality of IC die 318 are arranged within the first plurality of openings 304 in the die tray 302.

As shown in three-dimensional view 316b, the one or more robotic elements 314 are configured to bring the front-side of the die boat 306 into contact with the front-side of the die tray 302. The one or more robotic elements 314 also align the die boat 306 and the die tray 302 in a manner that allows for the first plurality of openings 304 to line-up with the second plurality of openings 308 (i.e., so that sidewalls of the first plurality of openings 304 and sidewalls of the second plurality of openings 308 align). In some embodiments, the one or more robotic elements 314 may align the first plurality of openings 304 with the second plurality of openings 308 by aligning outer edges of the die tray 302 and the die boat 306. In other embodiments, the die tray 302 and the die boat 306 may comprise one or more aligned marks (e.g., extending through the die tray 302 and/or the die boat 306), which are used by the one or more robotic elements 314 to align the first plurality of openings 304 with the second plurality of openings 308.

As shown in three-dimensional view 316c, the one or more robotic elements 314 rotate (e.g., flip over) the die boat 306 and the die tray 302. By rotating the die boat 306 and the die tray 302, the plurality of IC die 318 within the die tray 302 are concurrently transferred from the first plurality of openings 304 within the die tray 302 to the second plurality of openings 308 within the die boat 306 using the force of gravity. This transfer may result in the plurality of IC die 318 being arranged facedown into the second plurality of openings 308 within the die boat 306.

As shown in three dimensional view 316d, the one or more robotic elements 314 remove the die tray 302 from the die boat 306.

As shown in three-dimensional view 316e, the one or more robotic elements 314 provide a boat cover 320 onto the die boat 306. The boat cover 320 may comprise one or more magnetic components that attach the boat cover 320 to the die boat 306 using a magnetic force. The boat cover 320 may comprise a third plurality of openings 322 that overlie the plurality of IC die 318. In some embodiments, the third plurality of openings 322 are smaller than the plurality of IC die 318, so that a periphery of the third plurality of openings 322 cover a part of the plurality of IC die 318, thereby preventing the plurality of IC die 318 from falling out of the die boat 306. In some embodiments, the die boat 306 and the boat cover 320 may have different footprints.

Figure 4:
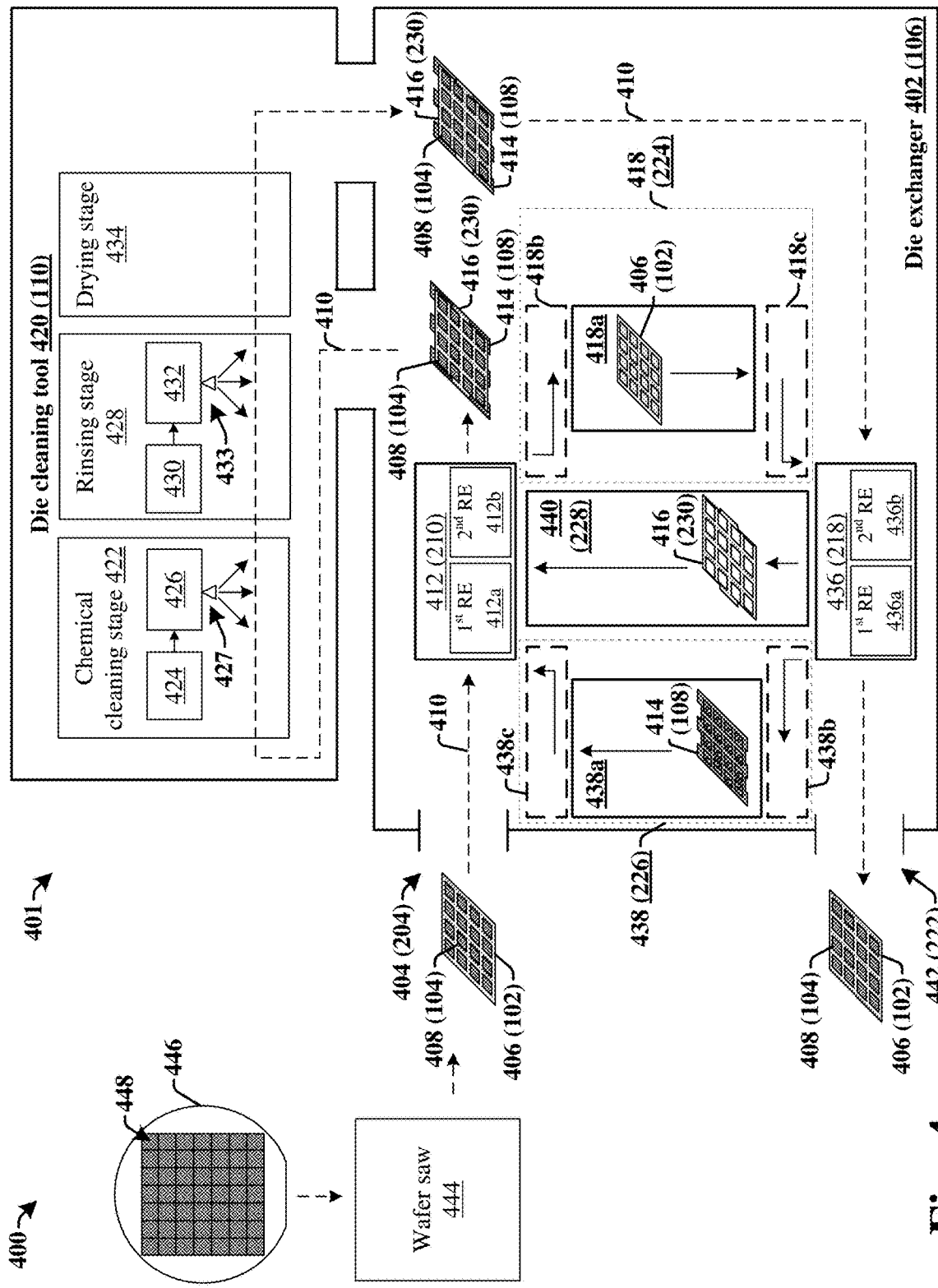
FIG. 4 illustrates some embodiments of a semiconductor processing system comprising an integrated chip processing tool having a die exchanger.

FIG. 4 illustrates some embodiments of a semiconductor processing system 400 comprising an integrated chip processing tool having a die exchanger.

The semiconductor processing system 400 comprises an integrated chip processing tool 401 having a die exchanger 402. The die exchanger 402 includes an input port 404 and an output port 442. The input port 404 is configured to receive a die tray 406 comprising a plurality of IC die 408 arranged within openings in an upper surface of the die tray 406. In some embodiments, the plurality of IC die 408 may be provided to the die tray 206 from a wafer saw 444. In such embodiments, the wafer saw 444 is configured to dice a semiconductor wafer 446 having a plurality of IC die 448 to form the plurality of IC die 408. In some embodiments, one or more additional processing tools (not shown) may be arranged between the wafer saw 444 and the integrated chip processing tool 401.

The die tray 406 is provided from the input port 404 to a first transfer module 412. The first transfer module 412 is configured to transfer the plurality of IC die 408 from the die tray 406 to a die boat 414. The first transfer module 412 is further configured to place a boat cover 416 onto the die boat 414 after the transfer is finished. The first transfer module 412 is also configured to transfer the die tray 406 (which is empty) to a tray buffer 418 after the transfer is finished.

In some embodiments, the first transfer module 412 may comprise a first robotic element 412a configured to hold the die tray 406 and a second robotic element 412b configured to hold the die boat 414. The first robotic element 412a and the second robotic element 412b are configured to move the die boat 414 onto the die tray 406 and to then rotate the die boat 414 and the die tray 406 to transfer of the plurality of IC die 408 from the die tray 406 to the die boat 414. In some embodiments, a third robotic element 412c may be configured to provide the boat cover 416 onto the die boat 414 after the transfer is finished. In some embodiments, the third robotic element 412c may be the same as the first robotic element 412a or the second robotic element 412b. In some embodiments, the first robotic element 412a, the second robotic element 412b, and/or the third robotic element 412c may comprise a robotic arm.

A die cleaning tool 420 is configured to receive the die boat 414 from the die exchanger 402. The die cleaning tool 420 is operable to clean (e.g., remove residue from) the plurality of IC die 408. In some embodiments, the die cleaning tool 420 comprises a chemical cleaning stage 422, a rinsing stage 428, and a drying stage 434. In such embodiments, the die boat 414 is provided along a path 410 that sequentially traverses the chemical cleaning stage 422, the rinsing stage 428, and the drying stage 434. In some embodiments, the path 410 may comprise a conveyer element configured to laterally transport the die boat 414 through the chemical cleaning stage 422, the rinsing stage 428, and the drying stage 434. In other embodiments, the path 410 may further comprise additional transfer elements, such as an elevator configured to vertically transport the die boat 414 and/or a robotic arm. The chemical cleaning stage 422 is configured to apply a wet chemical cleaning agent to the plurality of IC die 408. In some embodiments, the chemical cleaning stage 422 may comprise a chemical storage element 424 configured to store the wet chemical cleaning agent and a first distribution element 426 configured to apply the wet chemical cleaning agent to the plurality of IC die 408 within the die boat 414. In some embodiments, chemical cleaning stage 422 may be configured to apply a wet chemical cleaning agent comprising a peroxide and/or an acid (e.g., a sulfuric-peroxide mixture (SPM)) to the plurality of IC die 408. In some embodiments, the first distribution element 426 may comprise one or more nozzles configured to dispense the wet chemical cleaning agent onto the plurality of IC die 408.

The rinsing stage 428 is configured to receive the die boat 414 from the chemical cleaning stage 422 and to apply de-ionized water to the plurality of IC die 408. In some embodiments, the rinsing stage 428 may comprise a de-ionized water storage element 430 configured to store de-ionized water and a second distribution element 432 configured to apply the de-ionized water to the plurality of IC die 408 within the die boat 414. In some embodiments, the second distribution element 432 may comprise one or more nozzles 433 configured to dispense the de-ionized water onto the plurality of IC die 408.

The drying stage 434 is configured to receive the die boat 414 from the rinsing stage 428 and to dry the plurality of IC die 408. In some embodiments, the drying stage 434 may comprise a drying unit configured to apply a drying gas (e.g., oxygen, argon, etc.) onto the plurality of IC die 408. In some embodiments, the drying gas may have an elevated temperature (e.g., greater than that of the ambient temperature of the die cleaning tool 420. In other embodiments, the drying stage 434 may comprise a spin drying element configured to spin the plurality of IC die 408 at a high rotational rate (e.g., between approximately 1,000 RPM and approximately 10,000 RPM).

A second transfer module 436 is configured to receive the die boat 414 from the die cleaning tool 420. The second transfer module 436 is configured to transfer the plurality of IC die 408 from the die boat 414 back to the die tray 406, which was received by the second transfer module 436 from the tray buffer 418. In some embodiments, the second transfer module 436 may comprise a first robotic element 436a configured to hold the die tray 406 and a second robotic element 436b configured to hold the die boat 414. The first robotic element 436a and the second robotic element 436b are configured to move the die tray 406 onto the die boat 414 and to then rotate the die boat 414 and the die tray 406 to transfer of the plurality of IC die 408 from the die boat 414 to the die tray 406.

After the transfer is completed, the second transfer module 436 is configured to transfer the die boat 414 (which is empty) to a boat buffer 438, the boat cover 416 to a cover buffer 440, and the die tray 406 to the output port 442. The boat buffer 438 is configured to provide the die boat 414 to the first transfer module 412 and the cover buffer 440 is configured to provide the boat cover 416 to the first transfer module 412.

In some embodiments, the tray buffer 418, the boat buffer 438, and the cover buffer 440 may comprise separate elevators configured to vertically move the die tray 406, the die boat 414, and the boat cover 416 between the first transfer module 412 and the second transfer module 436. In some embodiments, the tray buffer 418, the boat buffer 438, and/or the cover buffer 440 may further comprise separate lateral transfer components configured to laterally move the die tray 406 and the die boat 414 between the first transfer module 412 and the second transfer module 436 and the elevators. For example, the tray buffer 418 may comprise a first lateral transfer component 418b configured to provide the die tray 406 between the first transfer module 412 and a first elevator 418a and a second lateral transfer component 418c configured to provide the die tray 406 between the first elevator 418a and the second transfer module 436. Similarly, the boat buffer 438 may comprise a third lateral transfer component 438b configured to provide the die boat 414 between the second transfer module 436 and a second elevator 438a and a fourth lateral transfer component 438c configured to provide the die boat 414 between the second elevator 438a and the first transfer module 412.

In some embodiments, the tray buffer 418, the boat buffer 438, and the cover buffer 440 may be arranged within the die exchanger 402 in a mirror image layout. For example, the tray buffer 418 may be arranged on an opposite side of the cover buffer 440 as the boat buffer 438 and may have follow a buffer path that is a mirror image of a buffer path of the boat buffer 438. For example, the tray buffer 418 may have lateral transfer components, 418b and 418c, on top and bottom ends of the first elevator 418a that are a mirror image of the lateral transfer components, 438b and 438c, on top and bottom ends of the second elevator 438a within the boat buffer 438. In some embodiments, since the cover buffer 440 is arranged between the tray buffer 418 and the boat buffer 438 it may not have a lateral transfer component. In some such embodiments, the tray buffer 418 and the boat buffer 438 may have elevator shafts that are laterally offset from input and/or output ports of the first transfer module 412 and the second transfer module 436.

Figure 5:
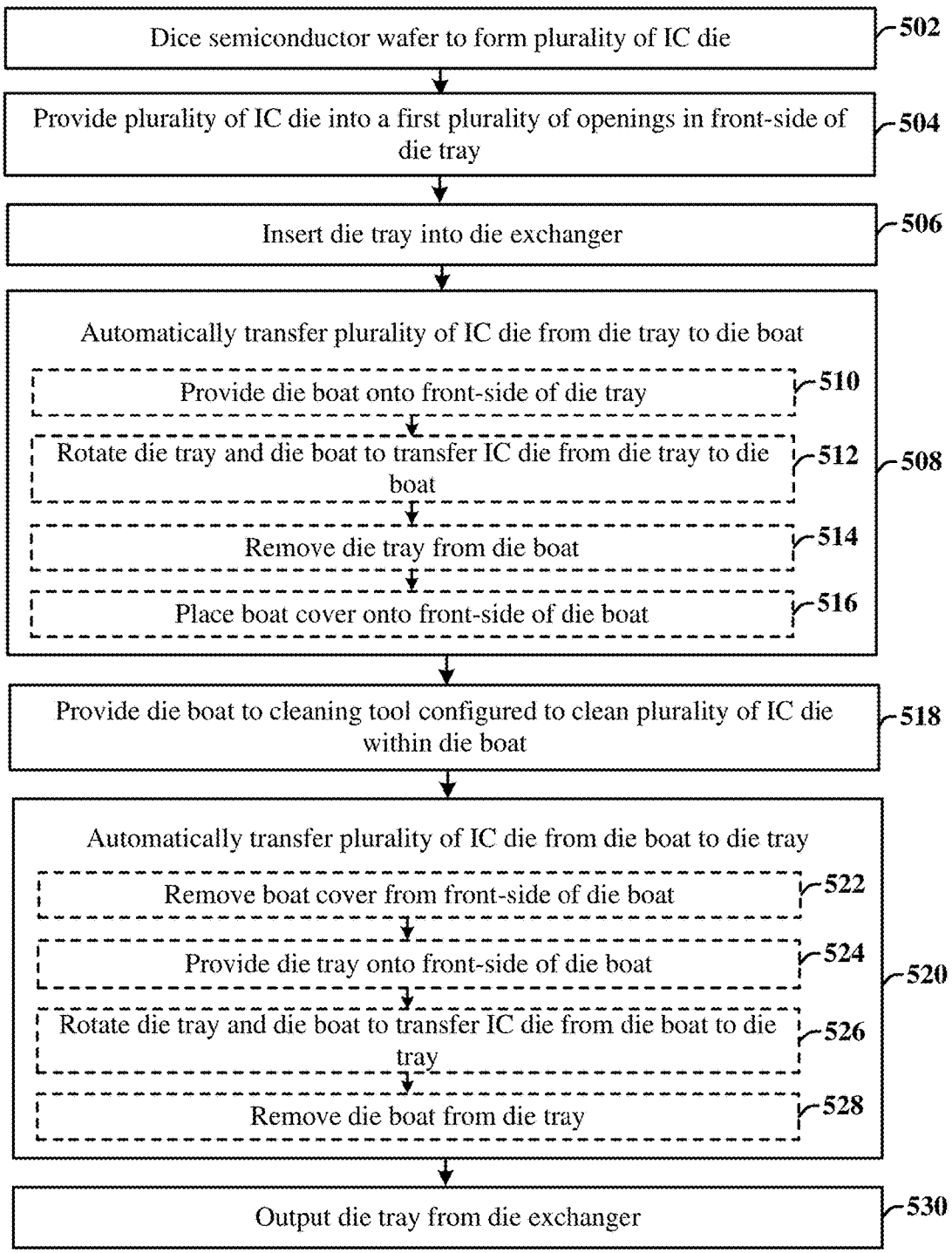
FIG. 5 illustrates a flow diagram of some embodiments of a method of automatically transferring a plurality of IC die from a die tray to a die boat.

FIG. 5 illustrates a flow diagram of some embodiments of a method 500 of automatically transferring a plurality of IC die from a die tray to a die boat.

While the disclosed method 500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a semiconductor wafer is diced to form a plurality of IC die.

At 504, the plurality of IC die are provided into a plurality of openings in a front-side of the die tray.

At 506, the die tray is inserted into a die exchanger.

At 508, the plurality of IC die are automatically transferred from the die tray to the die boat. In some embodiments, the plurality of IC die are automatically transferred from the die tray to the die boat according to acts 510-516.

At 510, a die boat is provided onto the die tray. In some embodiments, a front-side of the die boat may be brought into contact with the front-side of the die tray, and aligned so that the first plurality of openings in the die tray are aligned with a second plurality of openings in the die boat.

At 512, the die tray and the die boat are rotated (e.g., flipped over) to transfer the plurality of IC die from the die tray to the die boat. Rotating the die tray and the die boat cause the plurality of IC die to be concurrently transferred from the first plurality of openings in the die tray to a second plurality of openings in the die boat.

At 514, the die tray is removed from the die boat.

At 516, a boat cover is placed onto the front-side of the die boat.

At 518, the plurality of IC die within the die boat are cleaned. Cleaning the plurality of IC die removes residue from the plurality of IC die (e.g., residue from the dicing process at act 502).

At 520, the plurality of IC die are automatically transferred from the die boat to the die tray. In some embodiments, the plurality of IC die are automatically transferred from the die boat to the tray boat according to acts 522-528.

At 522, the boat cover is removed from the front-side of the die boat.

At 524, a die tray is provided onto the die boat. In some embodiments, the front-side of the die tray may be brought into contact with the front-side of the die boat, and aligned so that the first plurality of openings in the die tray are aligned with the second plurality of openings in the die boat.

At 526, the die tray and the die boat are rotated (e.g., flipped over) to transfer the plurality of IC die from the die boat to the die tray. Rotating the die tray and the die boat cause the plurality of IC die to be concurrently transferred from the second plurality of openings in the die boat to the first plurality of openings in the die tray.

At 528, the die boat is removed from the die tray.

At 530, the die tray is output from the die exchanger.

Therefore, the present disclosure relates to an integrated chip processing tool comprising an integrated chip (IC) die exchanger configured to automatically transfer a plurality of IC die between a die tray and a boat, and an associated method.

In some embodiments, the present disclosure relates to an integrated chip processing tool. The integrated chip processing tool comprises a die exchanger configured to receive a die tray comprising a plurality of IC die and to automatically transfer the plurality of IC die between the die tray and a die boat. The integrated chip processing tool further comprises an IC die processing tool configured to receive the die boat and to perform a processing step on the plurality of IC die within the die boat.

In other embodiments, the present disclosure relates to an integrated chip processing tool. The integrated chip processing tool comprises a first transfer module configured to receive a die tray comprising a plurality of IC die arranged within a first plurality of openings in a front-side of the die tray, and to automatically transfer the plurality of IC die from the first plurality of openings to a second plurality of openings in a front-side of a die boat. A die cleaning tool is configured to receive the die boat from the first transfer module and to perform a cleaning process on the plurality of IC die within the die boat. A second transfer module is configured to receive the die boat from the die cleaning tool and to automatically transfer the plurality of IC die from the second plurality of openings in the die boat back to the first plurality of openings in the die tray. A buffer unit is configured to move the die tray from the first transfer module to the second transfer module.

In yet other embodiments, the present disclosure relates to a method of transferring a plurality of IC die from a die tray to a die boat. The method comprises providing a plurality of IC die into a first plurality of openings in a front-side of a die tray. The method further comprises providing a die boat onto the die tray, wherein a front-side of the die boat faces the front-side of the die tray. The method further comprises rotating the die tray and the die boat to transfer the plurality of IC die from the first plurality of openings in the die tray to a second plurality of openings in the die boat. The method further comprises removing the die tray from the die boat.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip processing tool, comprising:
 a first transfer module including a first robotic arm disposed within a housing, wherein the first transfer module is configured to receive a single and unitary first die tray configured to hold a plurality of integrated chip (IC) die and to concurrently transfer all of the plurality of IC die held by the single and unitary first die tray to a single and unitary die boat;
 a cleaning tool configured to receive the single and unitary die boat and to clean all of the plurality of IC die held within the single and unitary die boat;
 a second transfer module comprising an additional robotic arm disposed within the housing and configured to concurrently transfer all of the plurality of IC die from the single and unitary die boat to a single and unitary second die tray;
 a boat buffer comprising a first elevator, the first elevator configured to transfer the single and unitary die boat from the second transfer module to the first transfer module;
 a tray buffer comprising a second elevator and configured to transfer the single and unitary first die tray from the first transfer module to the second transfer module;
 a cover buffer comprising a third elevator and configured to transfer a boat cover from the second transfer module to the first transfer module, wherein the tray buffer and the boat buffer are arranged in a mirror image layout around the cover buffer;
 wherein the single and unitary first die tray comprises edges continuously extending along a first single perimeter surrounding the plurality of IC die held by the single and unitary first die tray, and the single and unitary die boat comprises edges continuously extending along a second single perimeter; and
 wherein the first transfer module is configured to bring the single and unitary first die tray into contact with the single and unitary die boat so that all of the plurality of IC die are within the second single perimeter of the single and unitary die boat.

2. The integrated chip processing tool of claim 1, wherein the single and unitary first die tray is the single and unitary second die tray.

3. The integrated chip processing tool of claim 1,
 wherein the single and unitary first die tray comprises outermost surfaces surrounding a first number of recesses and the single and unitary die boat comprises outermost surfaces surrounding a second number of recesses, the first number of recesses equal to the second number of recesses; and
 wherein the first number of recesses and the second number of recesses are respectively configured to hold an IC die of the plurality of IC die.

4. The integrated chip processing tool of claim 1,
 wherein the single and unitary first die tray comprises a first continuous surface that surrounds a first number of recesses and the single and unitary die boat comprises a second continuous surface that surrounds a second number of recesses, the first number of recesses equal to the second number of recesses; and wherein the first number of recesses and the second number of recesses are respectively configured to hold an IC die of the plurality of IC die.

5. The integrated chip processing tool of claim 1, wherein the cleaning tool is further configured to provide the single and unitary die boat to the second transfer module.

6. The integrated chip processing tool of claim 5, wherein the cleaning tool comprises a chemical cleaning stage configured to receive the single and unitary die boat.

7. The integrated chip processing tool of claim 1, wherein the boat buffer is configured to move the single and unitary die boat along a first direction and along a second direction that is perpendicular to the first direction.

8. An integrated chip processing tool, comprising:
a first transfer module comprising a first robotic arm configured to receive a first die tray comprising a plurality of integrated chip (IC) die, to automatically transfer the plurality of IC die from the first die tray to a die boat, and to place a boat cover onto the die boat;
a second transfer module comprising an additional robotic arm configured to receive the die boat and to transfer the plurality of IC die from the die boat to a second die tray;
a cover buffer comprising an elevator configured to transfer the boat cover from the second transfer module to the first transfer module;
a tray buffer comprising a second elevator and configured to transfer the first die tray from the first transfer module to the second transfer module;
a boat buffer comprising a third elevator configured to transfer the die boat from the second transfer module to the first transfer module;
wherein the tray buffer and the boat buffer are arranged in a mirror image layout around the cover buffer; and
wherein the die boat is configured to move along a path that extends between the first transfer module and the second transfer module, the path separate from the cover buffer.

9. The integrated chip processing tool of claim 8, wherein the tray buffer is configured to move the first die tray along a first direction and along a second direction that is perpendicular to the first direction.

10. The integrated chip processing tool of claim 8, wherein the first die tray comprises a plurality of recesses respectively defined by sidewalls of the first die tray that extend in an unbroken path configured to surround an IC die.

11. The integrated chip processing tool of claim 8, wherein the first die tray comprises a plurality of recesses respectively defined by sidewalls of the first die tray that are coupled to an upper surface of the first die tray that continuously extends between outermost sidewalls of the first die tray.

12. The integrated chip processing tool of claim 8, wherein the die boat has a greater length than the first die tray.

13. An integrated chip processing tool, comprising:
a die tray of unitary construction configured to hold a plurality of integrated chip (IC) die, wherein the die tray of unitary construction comprises continuous edges forming a single perimeter around the plurality of IC die held by the die tray of unitary construction;
a die boat of unitary construction configured to hold the plurality of IC die, wherein the die boat of unitary construction comprises continuous edges forming a second single perimeter around the plurality of IC die;
a first transfer module configured to concurrently transfer the plurality of IC die from the die tray of unitary construction to the die boat of unitary construction; and
wherein the first transfer module comprises:
a first robotic arm configured to hold the die tray of unitary construction; and
a second robotic arm configured to hold the die boat of unitary construction and to bring a front-side of the die tray of unitary construction into contact with a front-side of the die boat of unitary construction, wherein the first robotic arm and the second robotic arm are configured to concurrently rotate the die tray of unitary construction and the die boat of unitary construction after the die tray of unitary construction and the die boat of unitary construction are brought into contact;
a second transfer module configured to concurrently transfer the plurality of IC die from the die boat of unitary construction to a second die tray of unitary construction, wherein the second die tray of unitary construction and the die boat of unitary construction have a same number of die openings respectively configured to hold a single IC die of the plurality of IC die;
a boat buffer comprising a first elevator and configured to transfer the die boat of unitary construction from the second transfer module to the first transfer module;
a tray buffer comprising a second elevator and configured to transfer the die tray of unitary construction from the first transfer module to the second transfer module;
a cover buffer comprising a third elevator and configured to transfer a boat cover that has been removed from the die boat of unitary construction to the first transfer module so that the boat cover can be re-used by the first transfer module; and
wherein the tray buffer and the boat buffer are arranged in a mirror image layout around the cover buffer.

14. The integrated chip processing tool of claim 13, wherein the second robotic arm is configured to bring the die tray of unitary construction into contact with the die boat of unitary construction so that the plurality of IC die from the die tray of unitary construction are within the second single perimeter of the die boat of unitary construction.

15. The integrated chip processing tool of claim 13, wherein the boat buffer and the tray buffer are arranged on opposing sides of the cover buffer.

16. The integrated chip processing tool of claim 13, further comprising:
a cleaning tool configured to receive the die boat of unitary construction and to operate upon all of the plurality of IC die held within the die boat of unitary construction.

17. The integrated chip processing tool of claim 13, wherein the second elevator is configured to vertically transfer the die tray of unitary construction.

18. The integrated chip processing tool of claim 13, wherein the second transfer module is configured to provide the boat cover from the die boat of unitary construction to the cover buffer.

19. The integrated chip processing tool of claim 13, wherein the die tray of unitary construction comprises a plurality of recesses within an upper surface of the die tray of unitary construction, the upper surface continuously extending between outermost sidewalls of the die tray of unitary construction.

20. The integrated chip processing tool of claim 19, wherein an upper surface of the die boat of unitary construction extends past one or more outermost sidewalls of the die tray of unitary construction when the front-side of the die tray of unitary construction is brought into contact with the front-side of the die boat of unitary construction.

* * * * *